(12) United States Patent
Galambos et al.

(10) Patent No.: US 6,542,107 B1
(45) Date of Patent: Apr. 1, 2003

(54) FLASH ANALOG-TO-DIGITAL CONVERTER USING FOLDED DIFFERENTIAL LOGIC ENCODER HAVING CAPACITORS WHICH DISTRIBUTE CHARGE

(75) Inventors: Tibi Galambos, Binyamina (IL); Moshe Leibowitz, Haifa (IL); Eliyahu Shamsaev, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/042,156

(22) Filed: Jan. 11, 2002

(51) Int. Cl.⁷ ................................. H03M 1/12
(52) U.S. Cl. .................. 341/172; 341/118; 341/158; 341/155; 341/163; 365/203; 365/149
(58) Field of Search ............................. 341/144, 155, 341/136, 172, 120, 118

(56) References Cited

U.S. PATENT DOCUMENTS

| | | | |
|---|---|---|---|
| 3,626,408 A | * 12/1971 | Carbrey | .................. 341/163 |
| 3,745,555 A | * 7/1973 | Carbrey | .................. 341/172 |
| 4,348,658 A | * 9/1982 | Carter | .................. 341/172 |
| 5,247,298 A | 9/1993 | Wei et al. | |
| 5,414,662 A | 5/1995 | Foss et al. | |
| 5,574,681 A | 11/1996 | Foss et al. | |
| 5,638,071 A | * 6/1997 | Capofreddi et al. | ......... 341/118 |
| 5,675,340 A | * 10/1997 | Hester et al. | ................ 341/172 |
| 5,684,487 A | * 11/1997 | Timko | .................. 341/172 |
| 5,889,485 A | * 3/1999 | Schneider | .................. 341/150 |
| 6,014,098 A | 1/2000 | Bult et al. | |
| 6,335,698 B1 | * 1/2002 | Ker et al. | .................. 341/143 |

* cited by examiner

Primary Examiner—Michael Tokar
Assistant Examiner—Lam T. Mai
(74) Attorney, Agent, or Firm—Browdy and Neimark PLLC

(57) ABSTRACT

An analog-to-digital converter, including a code generator, coupled to receive an input analog voltage and to one or more reference voltages, and adapted to generate a digital code responsive thereto, and one or more folded differential logic encoders (FDLEs). Each of the FDLEs includes a plurality of capacitors and switching logic. The switching logic is coupled to receive the digital code and distribute a charge between the plurality of capacitors responsive to the received digital code, and to output a digital bit indicative of the input analog voltage responsive to a magnitude of a potential generated by the distributed charge on at least one of the plurality of capacitors.

16 Claims, 10 Drawing Sheets

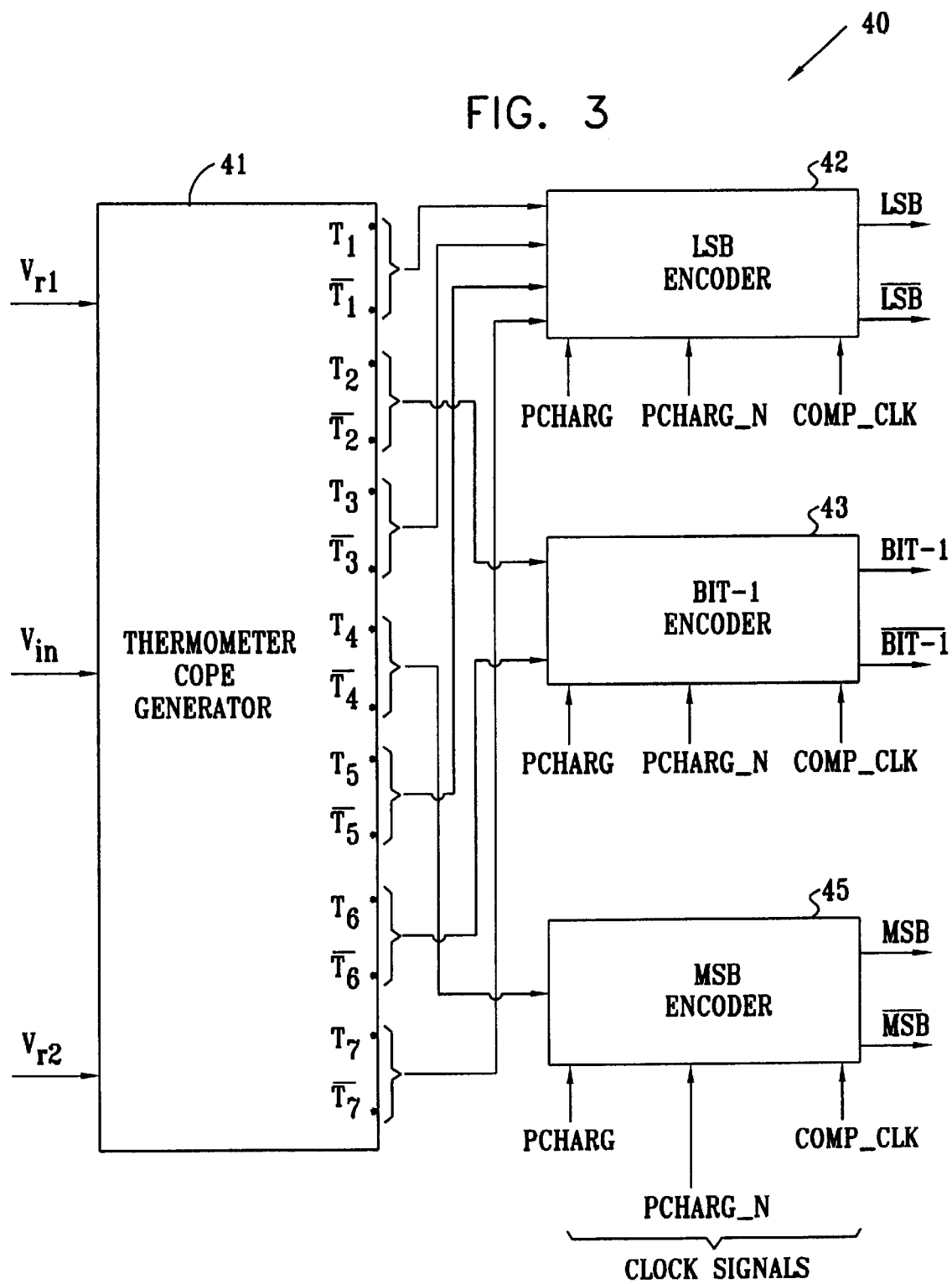

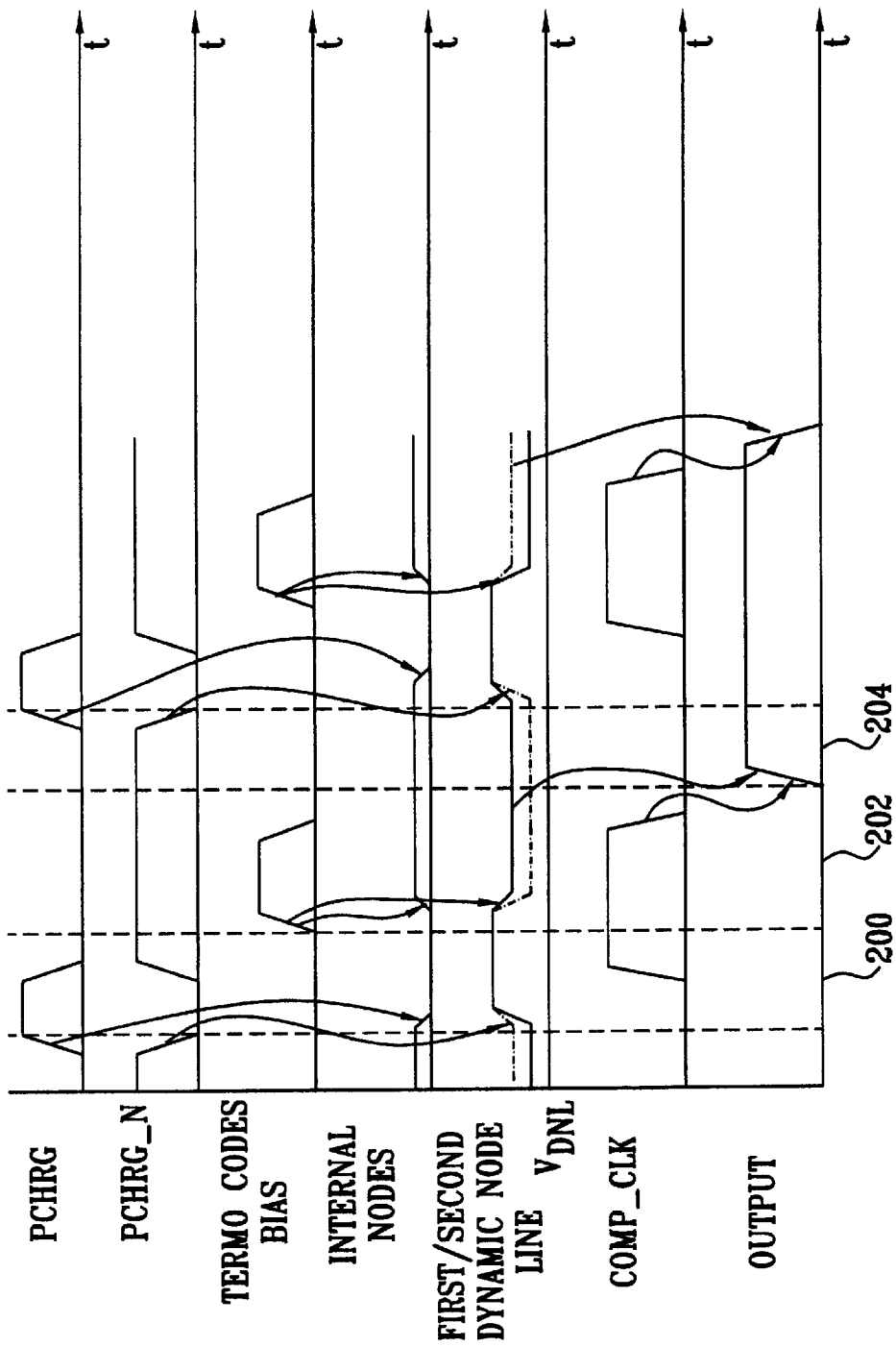

US 6,542,107 B1

FLASH ANALOG-TO-DIGITAL CONVERTER USING FOLDED DIFFERENTIAL LOGIC ENCODER HAVING CAPACITORS WHICH DISTRIBUTE CHARGE

FIELD OF THE INVENTION

The present invention relates generally to analog-to-digital converters, and specifically to analog-to-digital converters having folded differential logic encoding architectures.

BACKGROUND OF THE INVENTION

As speeds of operation of electronic equipment increase, analog-to-digital converters (ADCs) need to operate at increasing rates in order not become a bottleneck in the operation of the equipment. A known architecture in the electronic art, which inherently comprises a fast system for analog-to-digital conversion, is "flash" architecture, wherein a number of comparators operate simultaneously and in parallel. The readout of a flash ADC is substantially a "one-step" process.

FIG. 1 is a schematic block diagram of an m-bit flash analog-to-digital converter (ADC) 10, as is known in the art. Flash ADC 10 comprises a series resistor ladder 12, having $2^m$ equal valued resistors coupled to a first reference voltage Vr1 and a second reference voltage Vr2, which generate $2^m$ sequential potentials. The potentials are respectively applied to a first input of $2^m$ comparators 14, which have a voltage Vin to be digitized applied to a second input of the comparators. The output of the comparators is in the form of thermometer code, which is converted to binary code by a decoder 16. Decoder 16 typically uses conversion from thermometer code to Gray code as an intermediate step, in order to reduce the effects of sparkles and meta-stability in the thermometer code. ADC 10 is typically implemented as a very large scale integrated circuit (VLSI).

FIG. 2 is a schematic electronic diagram of a 3-bit ADC 20 using a folded differential logic (FDL) architecture, and giving a Gray code output, as is known in the art. A series ladder 21, which is driven by reference potentials Vr1 and Vr2, and an analog voltage input line 23 provide input levels to comparators 22A, 22B, ..., 22G. Thermometer code outputs, and their inverses, are generated as differential outputs by the comparators. The differential outputs of comparators 22A, 22B, ..., 22G are herein termed $(T_1, \overline{T_1})$, $(T_2, \overline{T_2})$, ..., $(T_7, \overline{T_7})$ respectively. Differential outputs $(T_1, \overline{T_1}), (T_2, \overline{T_2}), \ldots, (T_7, \overline{T_7})$ are input to respective differential pairs of transistors 24A, 24B, ..., 24G. Each differential pair of transistors is driven by a current source delivering a current I0. As shown in the diagram, the outputs of groups of the differential pairs are added, and the summed outputs generate respective potentials across resistors 25A, 25B, ..., 25F. The outputs of the differential pairs are connected to comparators 26, 28, and 30, so as to generate Gray code outputs D0, D1, and D2 respectively.

Thus, comparator 26, generating the least significant bit (LSB), receives its potential inputs from current source 32 (delivering a current I0) and differential pairs 24A, 24C, 24E, and 24G feeding through resistors 25E and 25F. Since four differential pairs are summed, comparator 26 has a folding factor of 4. The inputs to comparator 26 are generated on lines 27 and 29, which have a voltage corresponding to $T_1+\overline{T_3}+T_5+\overline{T_7}+1$ and a voltage corresponding to $\overline{T_1}+T_3+\overline{T_5}+T_7$ respectively. Thus, comparator 26 forms its output for a value of the LSB by effectively comparing $T_1+\overline{T_3}+T_5+\overline{T_7}+1$ with $\overline{T_1}+T_3+\overline{T_5}+T_7$.

Comparator 28 receives its potential inputs from a current source 34 and differential pairs 24B and 24F feeding through resistors 25C and 25D. Since two differential pairs are summed, comparator 28 has a folding factor of 2. The inputs to comparator 28 correspond to $T_2+\overline{T_6}+1$ and $\overline{T_2}+T_6$, and the comparator forms its output for a value of a first bit by effectively comparing $T_2+\overline{T_6}+1$ with $\overline{T_2}+T_6$. Similarly, comparator 30 has inputs corresponding to $T_4$ and $\overline{T_4}$, forming an output for a value of a most significant bit (MSB) by effectively comparing $T_4$ with $\overline{T_4}$.

Analog-to-digital converters exemplified by ADC 20 use FDL architecture implemented with bipolar transistors. However, bipolar transistor technology suffers from a number of known disadvantages compared with complementary metal oxide semiconductor (CMOS) technology. For example, bipolar transistors dissipate significantly higher powers and require relatively larger areas of silicon substrate compared with CMOS transistors.

U.S. Pat. No. 6,014,098, to Bult et al., whose disclosure is incorporated herein by reference, describes an ADC implemented in a CMOS technology. Outputs of comparators of the ADC are fed through cascaded stages of averaging amplifiers. The stages comprise folding, so that the cascading effectively implements multiple folding.

SUMMARY OF THE INVENTION

In preferred embodiments of the present invention, a folded differential logic (FDL) encoder section of an analog-to-digital converter (ADC) operates by redistributing charges stored within two sub-sections of the encoder. The charges are stored on capacitors, preferably by means of transistors acting as capacitors. The redistribution is implemented by switching logic, preferably implemented by switching transistors. Both types of transistors are most preferably implemented using complementary metal oxide semiconductor (CMOS) technology, although other technologies may also be used to implement the transistors. Operating an FDL encoder by redistributing charges substantially reduces power dissipation, compared to encoders which operate by comparing currents, since there is substantially no current flowing from supply to ground. In addition, rates of operation of charge redistribution encoders are significantly faster, and less area of silicon substrate is required, than in encoders comparing currents. This ADC design is therefore particularly well suited for CMOS implementation.

Within each sub-section of the FDL encoder, a primary capacitor is charged to an initial voltage. Each sub-section receives thermometer code which is produced in a thermometer code generator responsive to an analog input voltage. Within each sub-section the code activates a number of transistor switches, according to a value of the code, which are coupled to secondary capacitors. The charge is thereby redistributed between the primary capacitor and the number of the secondary capacitors that are coupled by the activated switches. The charge redistribution causes a voltage drop from the initial voltage, the drop being a function of the number of secondary capacitors receiving the charge, and thus of the thermometer code. The voltage drops in the two sub-sections are compared to generate an output bit corresponding to the input analog voltage.

Preferably, the ADC comprises a plurality of FDL encoder sections, each encoder section generating a specific bit corresponding to the analog input voltage.

There is therefore provided, according to a preferred embodiment of the present invention, an analog-to-digital converter, including:

a code generator, coupled to receive an input analog voltage and to one or more reference voltages, and adapted to generate a digital code responsive thereto; and one or more folded differential logic encoders (FDLEs), each of the FDLEs including:
  a plurality of capacitors; and
  switching logic, coupled to receive the digital code and distribute a charge between the plurality of capacitors responsive to the received digital code, and to output a digital bit indicative of the input analog voltage responsive to a magnitude of a potential generated by the distributed charge on at least one of the plurality of capacitors.

Preferably, the code generator includes a thermometer code generator, and the digital code includes thermometer code.

Preferably, the plurality of capacitors includes one or more primary capacitors and the switching logic includes one or more primary switches coupled to the one or more primary capacitors, which switches are adapted to couple the one or more primary capacitors to receive the charge.

Further preferably, the plurality of capacitors includes one or more secondary capacitors, and the switching logic includes one or more secondary switches coupled to receive the digital code and to connect the one or more secondary capacitors to the one or more primary capacitors responsive to the digital code, so as to distribute the charge between the one or more primary capacitors and the one or more secondary capacitors.

Preferably, the plurality of capacitors includes a first group of capacitors and a second group of capacitors, the switching logic includes a first group of switches and a second group of switches, the potential includes a first potential and a second potential, and at least some of the FDLEs include:
  a first sub-section, including the first group of capacitors and the first group of switches, receiving a first part of the digital code and generating the first potential responsive thereto;
  a second sub-section, including the second group of capacitors and the second group of switches, receiving a second part of the digital code and generating the second potential responsive thereto; and
  a comparator which outputs the digital bit responsive to a comparison of the first and the second potential.

Further preferably, the first part of the digital code is substantially an inverse of the second part of the digital code.

Preferably, the first group of capacitors includes a bias capacitor adapted to incorporate a bias level into the first potential, and the first group of switches includes a bias switch adapted to activate the bias capacitor.

Preferably, at least one of the first and second sub-sections includes one or more dummy circuit elements, so that at least some electrical properties of the first and second sub-sections are substantially similar.

There is further provided according to a preferred embodiment of the present invention, a method for converting an analog input voltage to a digital value, including:
  generating a digital code responsive to the input analog voltage and to one or more reference voltages;
  responsive to the digital code, distributing a charge between a plurality of capacitors in each of one or more folded differential logic encoders (FDLEs); and
  outputting a digital bit indicative of the input analog voltage from each of the one or more FDLEs responsive to a magnitude of a potential generated by the distributed charge therein.

Preferably, the digital code includes thermometer code.

Preferably, the plurality of capacitors includes one or more primary capacitors and distributing the charge includes storing the charge on the one or more primary capacitors.

Preferably, each of the FDLEs includes one or more secondary switches, the plurality of capacitors includes one or more secondary capacitors, and distributing the charge includes:
  the one or more secondary switches receiving the digital code; and
  connecting the one or more secondary capacitors to the one or more primary capacitors responsive to the digital code via the one or more secondary switches, so as to distribute the charge between the one or more primary capacitors and the one or more secondary capacitors.

Preferably, the plurality of capacitors includes a first group of capacitors and a second group of capacitors, each of the FDLEs includes a first group of switches and a second group of switches, the potential includes a first potential and a second potential, and each of the FDLEs includes a first sub-section, including the first group of capacitors and the first group of switches, and a second sub-section, including the second group of capacitors and the second group of switches, wherein the charge includes a first charge and a second charge, and wherein distributing the charge includes:
  receiving a first part of the digital code in the first sub-section;
  activating the first group of switches responsive to the first part of the digital code;
  distributing the first charge responsive to the first group of activated switches;
  generating the first potential responsive to the distributed first charge;
  receiving a second part of the digital code in the second sub-section;
  activating the second group of switches responsive to the second part of the digital code;
  distributing the second charge responsive to the second group of activated switches; and
  generating the second potential responsive to the distributed second charge; and
  wherein outputting the digital bit includes comparing the first and the second potential.

Preferably, the first part of the digital code is substantially an inverse of the second part of the digital code.

Preferably, the first group of capacitors includes a bias capacitor adapted to incorporate a bias level into the first potential, and the first group of switches includes a bias switch adapted to activate the bias capacitor.

Preferably, at least one of the first and second sub-sections includes one or more dummy circuit elements, so that at least some electrical properties of the first and second sub-sections are substantially similar.

The present invention will be more fully understood from the following detailed description of the preferred embodiments thereof, taken together with the drawings, in which:

BRIEF DESCRIPTION OF THE DRAWINGS

FIG. 3 which is a schematic block diagram of a charge sharing 3-bit encoder, according to a preferred embodiment of the present invention;

FIG. 7 is a schematic timing diagram for the encoder of FIG. 3, according to a preferred embodiment of the present invention.

DETAILED DESCRIPTION OF PREFERRED EMBODIMENTS

Figure 1:
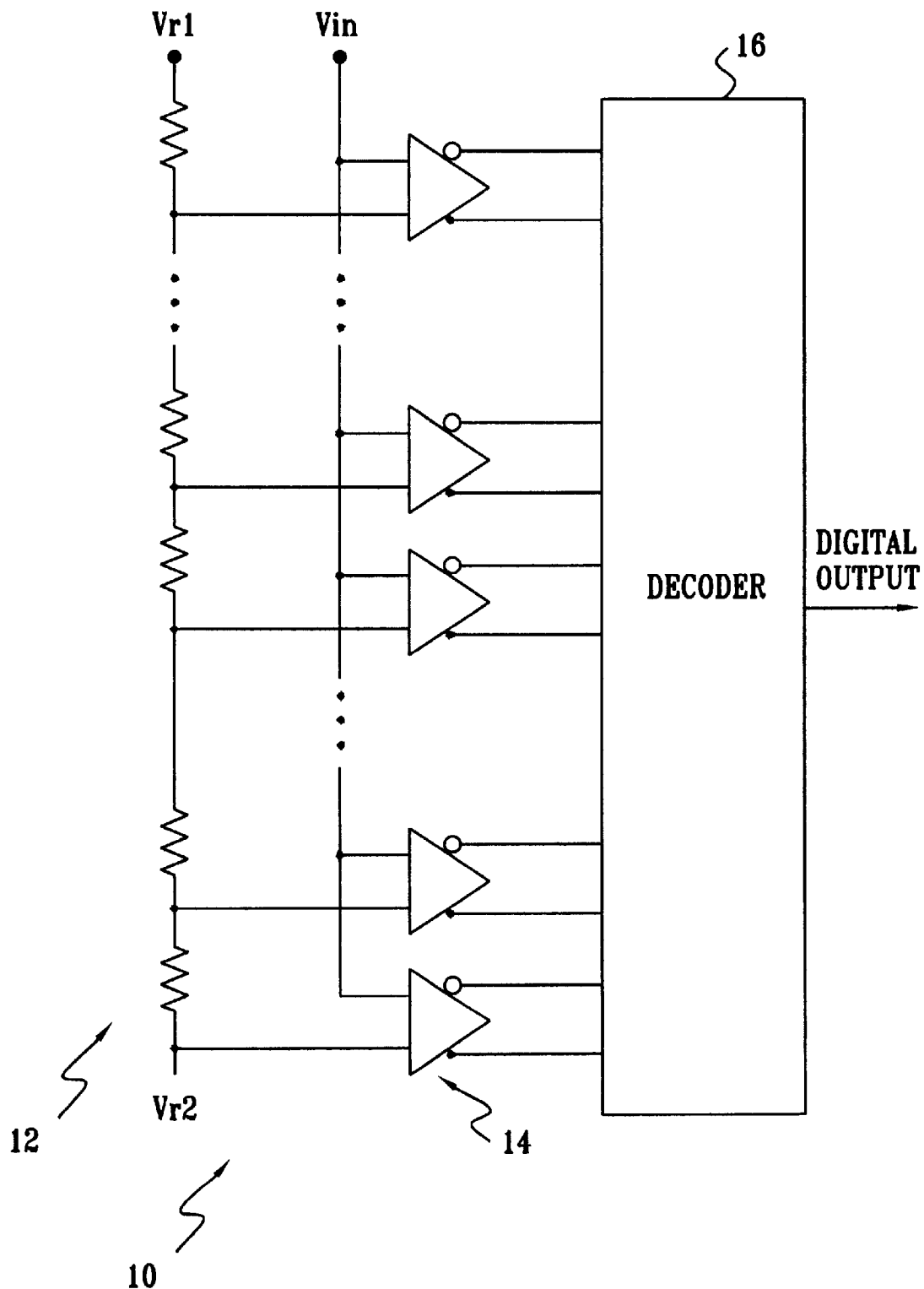
FIG. 1 is a schematic block diagram of an m-bit flash analog-to-digital converter (ADC), as is known in the art.

Reference is now made to FIG. 3 which is a schematic block diagram of a charge sharing 3-bit encoder 40, according to a preferred embodiment of the present invention. Encoder 40 receives its input as thermometer code $(T_1,\overline{T_1})$, $(T_2,\overline{T_2})$, $(T_3,\overline{T_3})$, $(T_4,\overline{T_4})$, $(T_5,\overline{T_5})$, $(T_6,\overline{T_6})$, $(T_7,\overline{T_7})$. The thermometer code is preferably generated in a thermometer code generator 41, most preferably comprising a series resistor ladder coupled, together with an input voltage Vin to be digitized, to differential comparators as described above with reference to FIG. 2. Encoder 40 is most preferably implemented as part of a very large scale integrated circuit (VLSI). Alternatively, encoder 40 is implemented as a combination of custom and/or semi-custom and/or discrete components.

Encoder 40 comprises a least significant bit (LSB) encoder section 42, a BIT-1 encoder section 43, and a most significant bit (MSB) encoder section 45. All three sections operate on generally similar principles, each section acting as a folded differential logic (FDL) encoder, and comprising switching logic, preferably implemented as transistor switches, coupled to capacitors, also preferably implemented from transistors. Furthermore, all sections receive substantially identical clock signals PCHARG, PCHARG_N, and COMP_CLK for their operation, and generate the respective LSB, BIT-1, and MSB responsive to the clock signals. The operation and implementation of sections 42, 43, and 45 are described in more detail below with reference to FIGS. 4A, 4B, 5A, 5B, 6A, and 6B. The function of the clock signals is described in more detail below with reference to a timing diagram (FIG. 7). While encoder 40 is a 3-bit encoder, it will be appreciated that encoders for substantially any number of bits may be implemented according to the principles described herein for encoder 40.

Figure 4A:
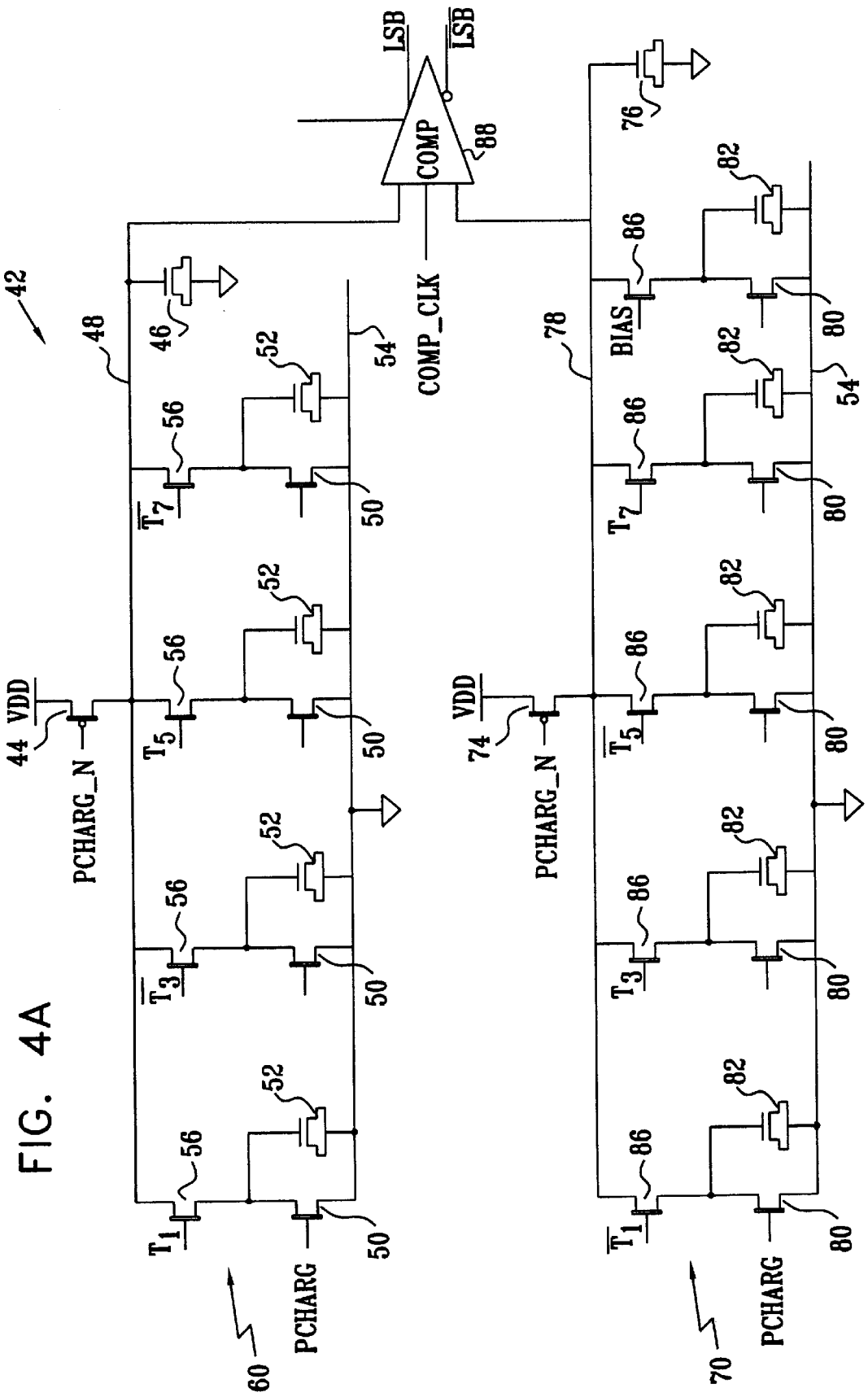
FIG. 4A is a schematic electronic circuit of a least significant bit section of the encoder of FIG. 3, according to a preferred embodiment of the present invention.
Figure 4B:
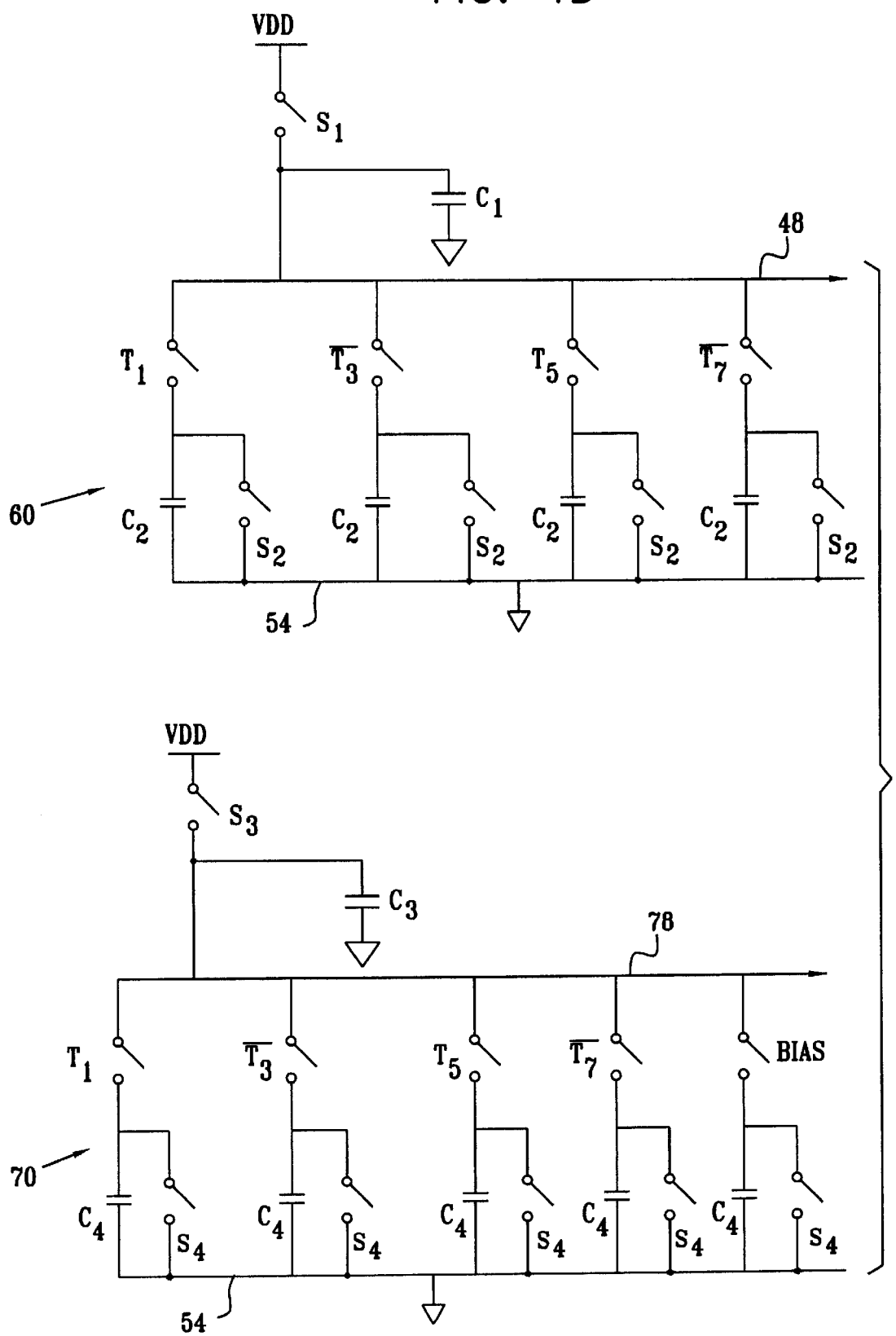
FIG. 4B is a schematic equivalent circuit of the section of FIG. 4A, according to a preferred embodiment of the present invention.

FIG. 4A is a schematic electronic circuit of LSB-encoder section 42, and FIG. 4B is a schematic equivalent circuit of the section, according to a preferred embodiment of the present invention. Section 42 is implemented as two sub-sections 60 and 70. Sub-section 60 comprises a PMOS transistor 44, which is used as a switch $S_1$ to pre-charge one or more generally similar transistors 46 coupled to act as primary capacitors for the sub-section. Transistor 44 is activated by a signal PCHARG_N, described in more detail with reference to FIG. 7 below. Transistors 46 are coupled between a first LSB-dynamic node line 48 and a common "ground" line 54, so forming a capacitance $C_1$ between the lines. $C_1$ is substantially equal to the sum of the capacitances of individual transistors 46.

Sub-section 60 also comprises four generally similar NMOS transistors 50, which are used as switches $S_2$ to open-circuit and short-circuit a respective plurality of generally similar NMOS transistors 52 coupled to act as secondary capacitors. Transistors 50 are activated by a signal PCHARG. Thus, each pair of transistors 50 and 52 form a capacitor-switch pair. Each capacitor of the capacitor-switch pair is assumed to have a capacitance $C_2$, and all capacitor-switch pairs are coupled at one side of the pair to common ground line 54. Each capacitor-switch pair is coupled at its other side to a respective NMOS transistor 56, which acts as a series switch between the pair and line 48.

Transistors 56 are activated via their gates by respective thermometer code signals $T_1$, $\overline{T_3}$, $T_5$, and $\overline{T_7}$. Thus, as will be described in more detail below with reference to FIG. 7, a level developed on line 48 corresponds to a value of $T_1+\overline{T_3}+T_5+\overline{T_7}$.

Sub-section 70 comprises a PMOS transistor 74 acting as a switch $S_3$. Transistor 74 is coupled to one or more generally similar transistors 76 coupled as primary capacitors. Transistor 74 is activated by signal PCHARG_N. Transistors 76 form a capacitance $C_3$ between a second LSB-dynamic node line 78 and common line 54.

Sub-section 70 also comprises five generally similar NMOS transistors 80, which are used as switches $S_4$ to open-circuit and short-circuit five generally similar NMOS transistors 82 acting as secondary capacitors. Transistors 80 are activated by signal PCHARG. Thus, each pair of transistors 80 and 82 form a capacitor-switch pair. Each capacitor of the capacitor-switch pair is assumed to have a capacitance $C_4$, and all capacitor-switch pairs are coupled at one side of the pair to common line 54. Each capacitor-switch pair is coupled at its other side to a respective NMOS transistor 86, which acts as a series switch between the pair and line 78. Four transistors 86 are activated via their gates by respective thermometer code signals $\overline{T_1}$, $T_3$, $\overline{T_5}$, and $T_7$. A fifth transistor 86 has a bias level applied to its gate, the effect of the bias being explained with reference to FIG. 7. As described therein, a level developed on line 78 corresponds to a value of $\overline{T_1}+T_3+\overline{T_5}+T_7-1$. Capacitor-switch pairs described herein comprise switches which act as switching logic coupling capacitors with each other.

A comparator 88 receives clock signal COMP_CLK, and input potentials from lines 48 and 78, and compares the inputs. Comparator 88 outputs a value of the LSB of the Gray code corresponding to the input voltage, and an inverse of the value.

Figure 5A:
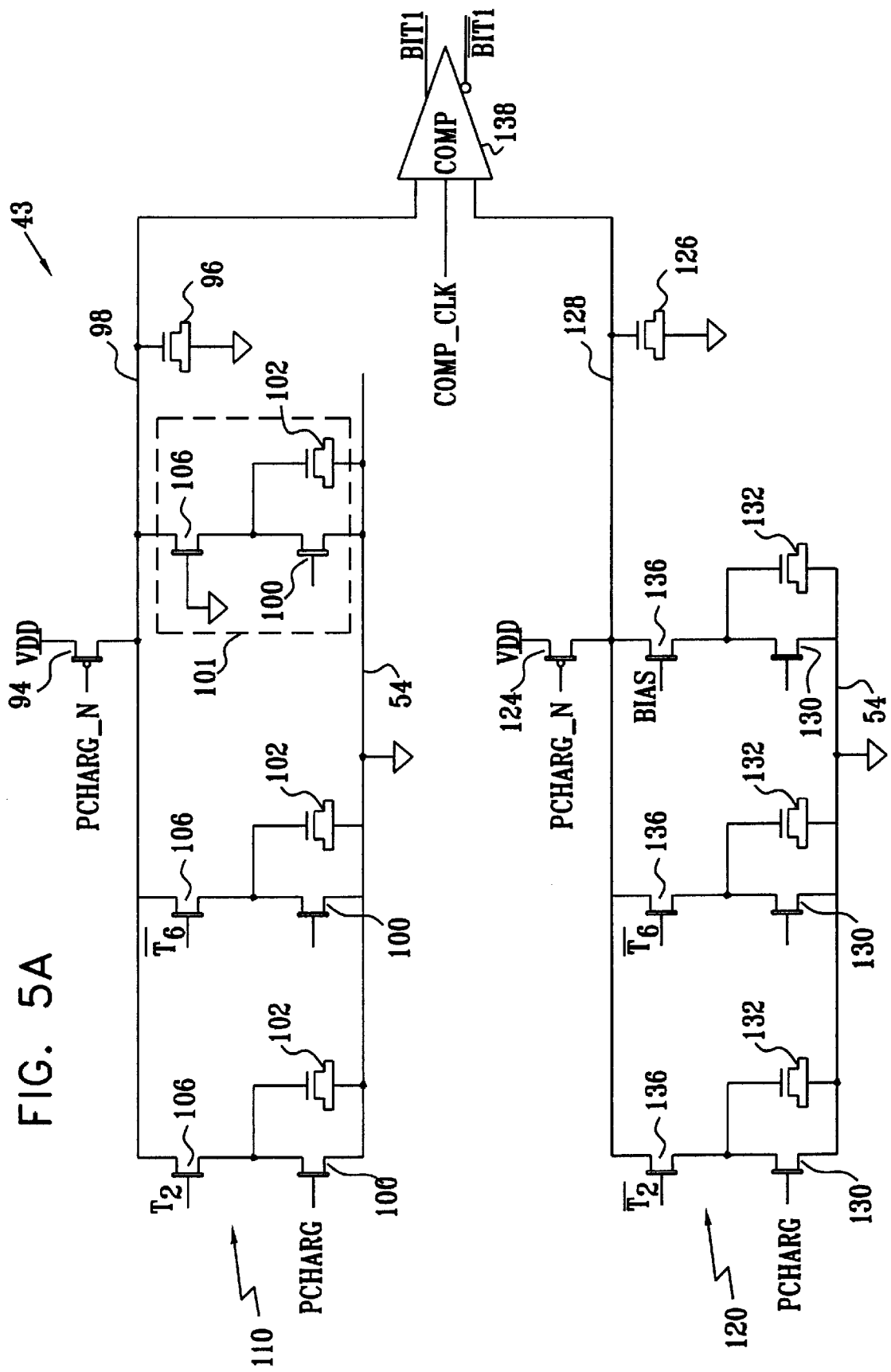
FIG. 5A is a schematic electronic circuit of a BIT-1 section of the encoder of FIG. 3, according to a preferred embodiment of the present invention.
Figure 5B:
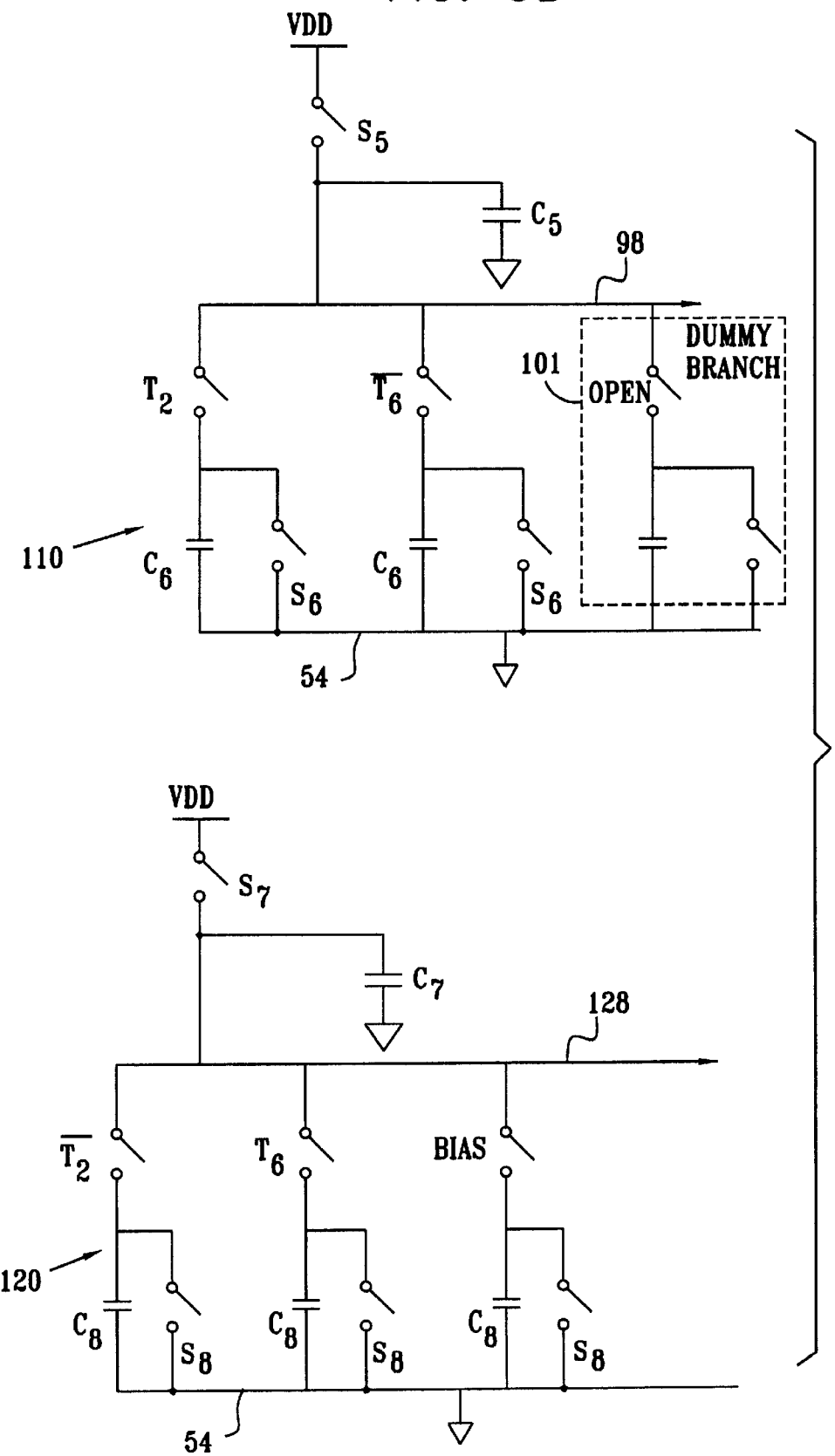
FIG. 5B is a schematic equivalent circuit of the section of FIG. 5A, according to a preferred embodiment of the present invention.

FIG. 5A is a schematic electronic circuit of BIT-1 encoder section 43, and FIG. 5B is a schematic equivalent circuit of the section, according to a preferred embodiment of the present invention. Section 43 is implemented as two sub-sections 110 and 120. Sub-section 110 comprises a PMOS transistor 94, which is used as a switch $S_5$ to pre-charge one or more generally similar transistors 96 coupled to act as primary capacitors. Transistor 94 is activated by signal PCHARG_N. Transistors 96 are coupled between a first BIT-1 dynamic node line 98 and common line 54, forming a capacitance $C_5$ between the lines.

Sub-section 110 also comprises two generally similar NMOS transistors 100, which are used as switches $S_6$ to open-circuit and short-circuit two generally similar NMOS transistors 102 coupled to act as secondary capacitors. Transistors 100 are activated by signal PCHARG. Thus, each pair of transistors 100 and 102 form a capacitor-switch pair. Each capacitor of the capacitor-switch pair is assumed to have a capacitance $C_6$, and all capacitor-switch pairs are coupled at one side of the pair to common ground line 54. Each capacitor-switch pair is coupled at its other side to a respective NMOS transistor 106, which acts as a series switch between the pair and line 98.

Transistors 106 are activated via their gates by respective thermometer code signals $T_2$ and $\overline{T_6}$. As described in more detail below, a level developed on line 98 corresponds to $T_2 + \overline{T_6}$.

Sub-section 120 comprises a PMOS transistor 124 acting as a switch $S_7$. Transistor 124 is coupled to one or more generally similar transistors 126 acting as primary capacitors. Transistor 124 is activated by signal PCHARG_N. Transistors 126 form a capacitance $C_7$ between a second BIT-1 dynamic node line 128 and common line 54.

Sub-section 120 also comprises three generally similar NMOS transistors 130, which are used as switches $S_8$ to open-circuit and short-circuit three generally similar NMOS transistors 132 coupled to act as secondary capacitors. Transistors 130 are activated by signal PCHARG. Thus, each pair of transistors 130 and 132 form a capacitor-switch pair. Each capacitor of the capacitor-switch pair is assumed to have a capacitance $C_8$, and all capacitor-switch pairs are coupled at one side of the pair to common line 54. Each capacitor-switch pair is coupled at its other side to a respective NMOS transistor 136, which acts as a series switch between the pair and line 128. Two transistors 136 are activated via their gates by respective thermometer code signals $\overline{T_2}$ and $T_6$. A third transistor 136 has a bias level applied to its gate. Thus, as described below, a level developed on line 128 corresponds to $\overline{T_2} + T_6 - 1$.

A comparator 138 receives clock signal COMP_CLK and input potentials from lines 98 and 128, and compares the inputs. Comparator 138 outputs a value of the first bit of the Gray code corresponding to the input voltage, and an inverse of the value.

Figure 6A:
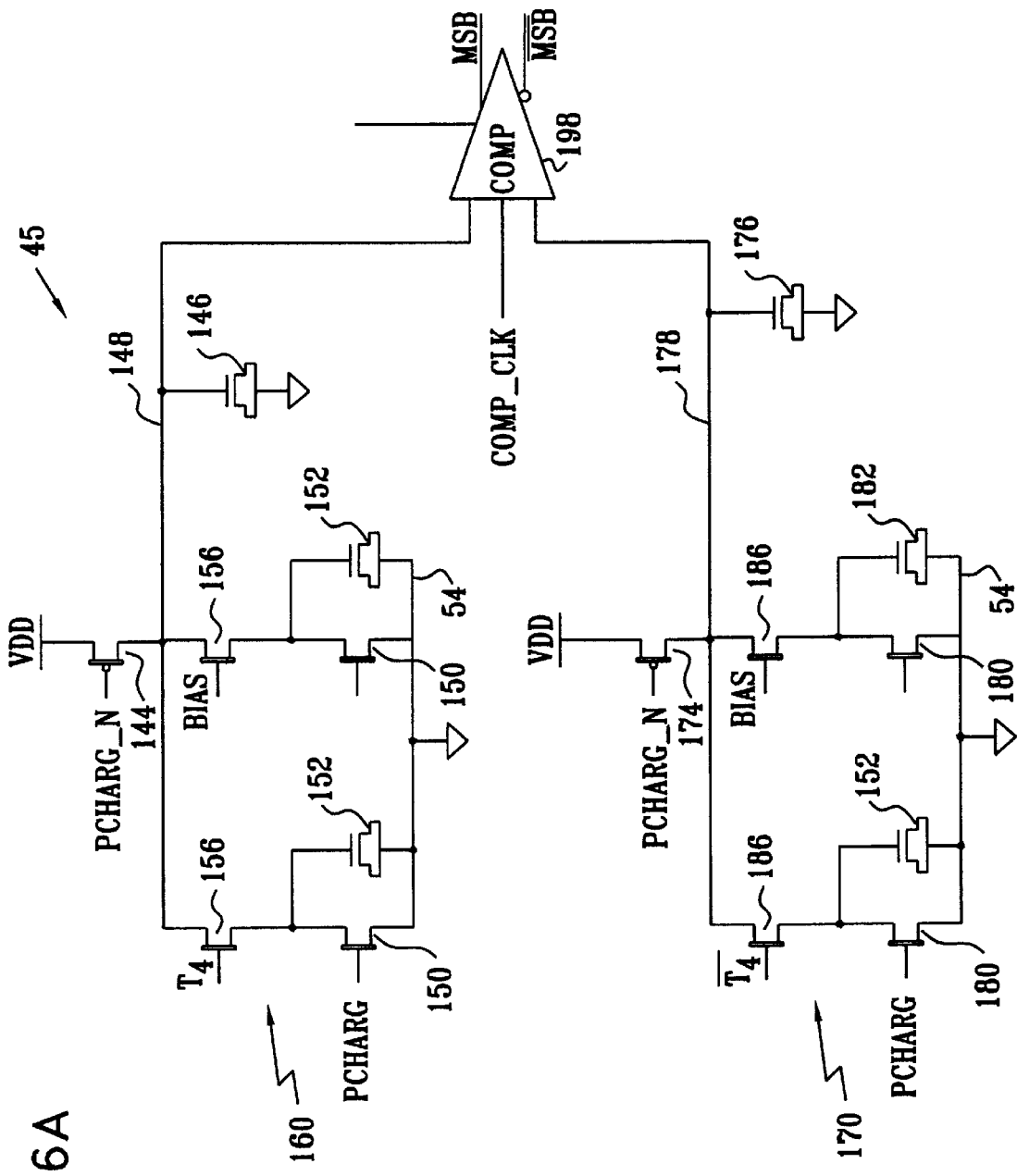
FIG. 6A is a schematic electronic circuit of a most significant bit section of the encoder of FIG. 3, according to a preferred embodiment of the present invention.
Figure 6B:
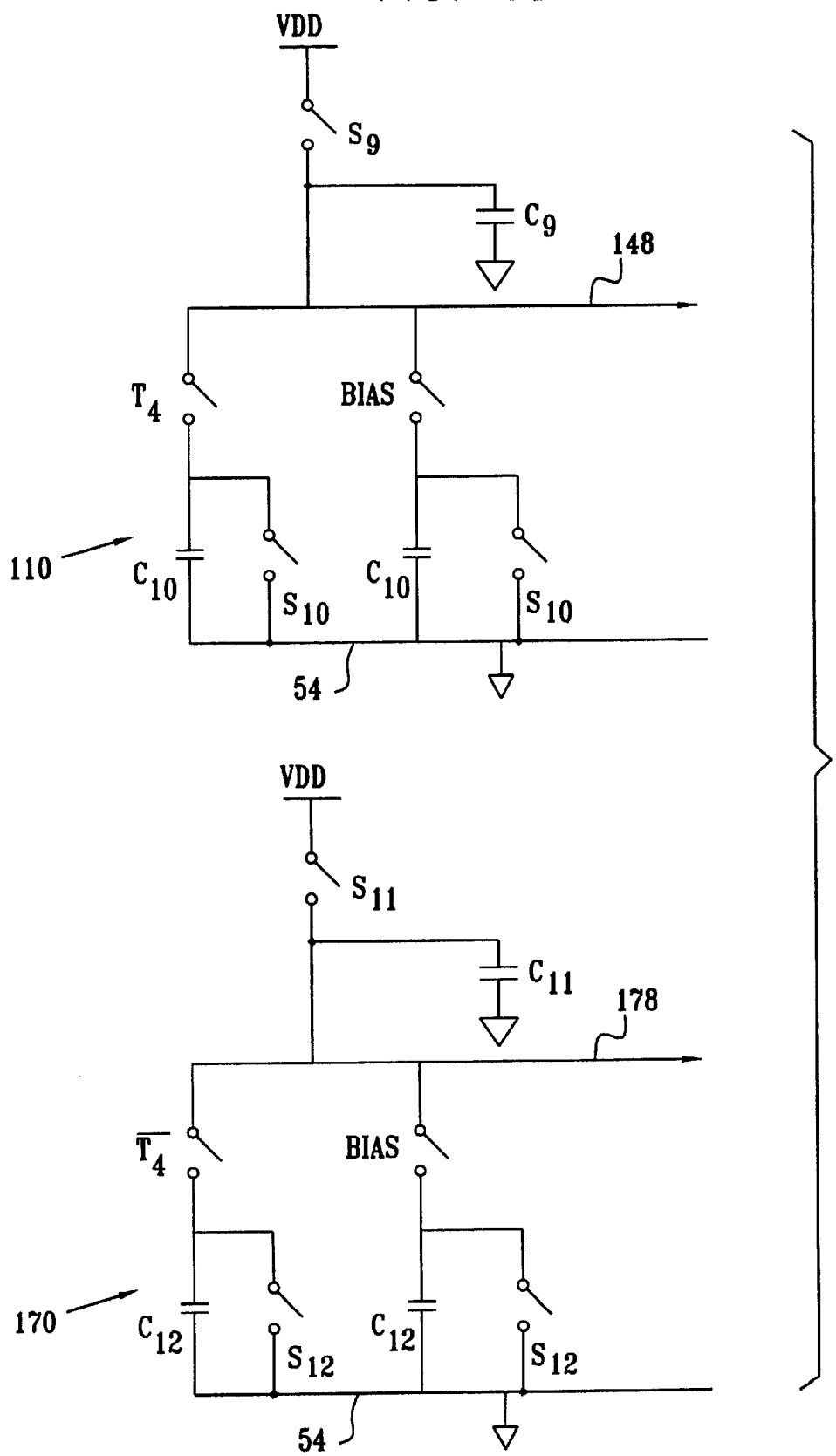
FIG. 6B is a schematic equivalent circuit of the section of FIG. 6A, according to a preferred embodiment of the present invention.

FIG. 6A is a schematic electronic circuit of MSB encoder section 45, and FIG. 6B is a schematic equivalent circuit of the section, according to a preferred embodiment of the present invention. Section 45 is implemented as two sub-sections 160 and 170. Sub-section 160 comprises a PMOS transistor 144, which is used as a switch $S_9$ for one or more generally similar transistors 146 acting as a primary capacitor. Transistor 144 is activated by signal PCHARG_N. Transistors 146 are coupled between a first MSB dynamic node line 148 and common line 54, forming a capacitance $C_9$ between the lines. $C_9$ is substantially equal to the sum of the capacitances of individual transistors 146.

Sub-section 160 also comprises two generally similar NMOS transistors 150, which are used as switches $S_{10}$ to open-circuit and short-circuit two generally similar NMOS transistors 152 coupled to act as secondary capacitors. Transistors 150 are activated by signal PCHARG. Thus, each pair of transistors 150 and 152 form a capacitor-switch pair. Each capacitor of the capacitor-switch pair is assumed to have a capacitance $C_{10}$, and both capacitor-switch pairs are coupled at one side of the pair to common ground line 54. Each capacitor-switch pair is coupled at its other side to a respective NMOS transistor 156, which acts as a series switch between the pair and line 148.

Transistors 156 are activated via their gates by thermometer code signal $T_4$ and a Bias signal. As described in more detail below, a level developed on line 148 corresponds to $T_4 - 1$.

Sub-section 170 comprises a PMOS transistor 174 acting as a switch $S_{11}$. Transistor 174 is coupled to one or more generally similar transistors 176 acting as capacitors. Transistor 174 is activated by signal PCHARG_N. Transistors 176 form a capacitance $C_{11}$ between a second MSB dynamic node line 178 and common line 54.

Sub-section 170 comprises two generally similar NMOS transistors 180, which are used as switches S12 to open-circuit and short-circuit two similar NMOS transistors 182 acting as capacitors. Transistors 180 are activated by signal PCHARG. Thus, each pair of transistors 180 and 182 form a capacitor-switch pair. Each capacitor of the capacitor-switch pair is assumed to have a capacitance $C_{12}$, and all capacitor-switch pairs are coupled at one side of the pair to common line 54. Each capacitor-switch pair is coupled at its other side to a respective NMOS transistor 186, which acts as a series switch between the pair and line 178. One transistor 186 is activated via its gate by thermometer code signal $\overline{T_4}$, the other transistor 186 is activated by a Bias signal. As described below, a level developed on line 178 corresponds to $\overline{T_4} - 1$.

A comparator 198 receives clock signal COMPCLK and inputs from lines 148 and 178, and compares the inputs. Comparator 198 outputs a value of the MSB of the Gray code corresponding to the input voltage, and an inverse of the value.

FIG. 7 is a schematic timing diagram for encoder 40, according to a preferred embodiment of the present invention. In a pre-charge period 200 signals PCHARG_N and PCHARG are both set, causing transistors 44, 74, 94, 124, 144, 174 and transistors 50, 80, 100, 130, 150, 180 to conduct. This has the effect of closing switches $S_1$, $S_2$, ..., $S_{12}$, hereinbelow termed switches S. The COMP_CLK signal, input to comparators 88, 138, and 198, deactivates the comparators by transiting high. During this period the thermometer codes and the bias levels are not input to their switches (transistors 56, 86, 106, 136, 156, and 186) and these switches are set open. Thus, in period 200, secondary capacitors $C_2$, $C_4$, $C_6$, $C_8$, $C_{10}$, and $C_{12}$, hereinbelow termed $C_{even}$, are discharged, as shown by an internal node signal, representing a potential on the capacitors, moving to zero. Also in period 200, primary capacitors $C_1$, $C_3$, $C_5$, $C_7$, $C_9$, and $C_{11}$, hereinbelow termed $C_{odd}$, are charged to $V_{DD}$, and lines 48, 78, 98, 128, 148, and 178 move to $V_{DD}$, as shown by a first dynamic node signal and a second dynamic node signal both moving to $V_{DD}$.

In an evaluation period 202, PCHARG and PCHARG_N are both unset, causing switches S to open. Also in this period, the thermometer codes are input to their respective switches, as shown by a Thermo code/Bias signal moving high. The thermometer code switches close according to the level of the code received, and the internal node signal rises correspondingly. The bias level is also input to its switch, causing the bias level switch to close. The closing of a thermometer code switch or the bias level switch causes the respective secondary $C_{even}$s to be coupled to their primary $C_{odd}$. The coupling in turn causes the charge on the $C_{odd}$ to be redistributed between the $C_{odd}$ and its available $C_{even}$s. It will be appreciated that since the bias level switch is toggled regardless of the thermometer code, the respective bias level capacitor is always available for charge redistribution.

In sections 60, 110, and 160, the number of available $C_{even}$s may vary from 0 to 4, depending on the thermometer code. Similarly, in sections 70, 120, and 170, the number of available $C_{even}$s may vary from 1 to 5. If a number of available $C_{even}$s is assumed to be M, where M is any whole number from 0 to 5, then a potential on dynamic node line 48, 78, 98, 128, 148, or 178 is given by:

$$V_{dyn} = \frac{C_{odd} \cdot V_{DD}}{C_{odd} + M \cdot C_{even}} \quad (1)$$

wherein $V_{dyn}$ is the potential on a dynamic node line after a charge redistribution event which couples a primary $C_{odd}$ to M secondary $C_{even}$s via the line.

It will be understood from equation (1) that $V_{dyn}$ is a substantially monotonically decreasing function with respect to M, decreasing as M increases. Thus, a level $V_{dyn}$ of lines 48, 78, 98, 128, 148, and 178 will drop from the values of $V_{DD}$ achieved in pre-charge period 100, according to the value of M associated with the respective lines. Waveform $V_{dyn}$ in FIG. 7 shows an example of signals on lines 48 and 78 respectively, illustrating the drop from $V_{DD}$ for different Ms.

After values of $V_{dyn}$ on lines 48, 78, 98, 128, 148, and 178 have settled to their changed values, an evaluation period 204 begins by a COMP_CLK signal transiting low. The transit of the COMP_CLK signal causes comparators 88, 138, and 198 to compare their respective incoming signals. Depending on the results of the comparison, outputs of the comparators, and the inverses, are set to 0 or 1, as exemplified by an output signal.

Figure 2:
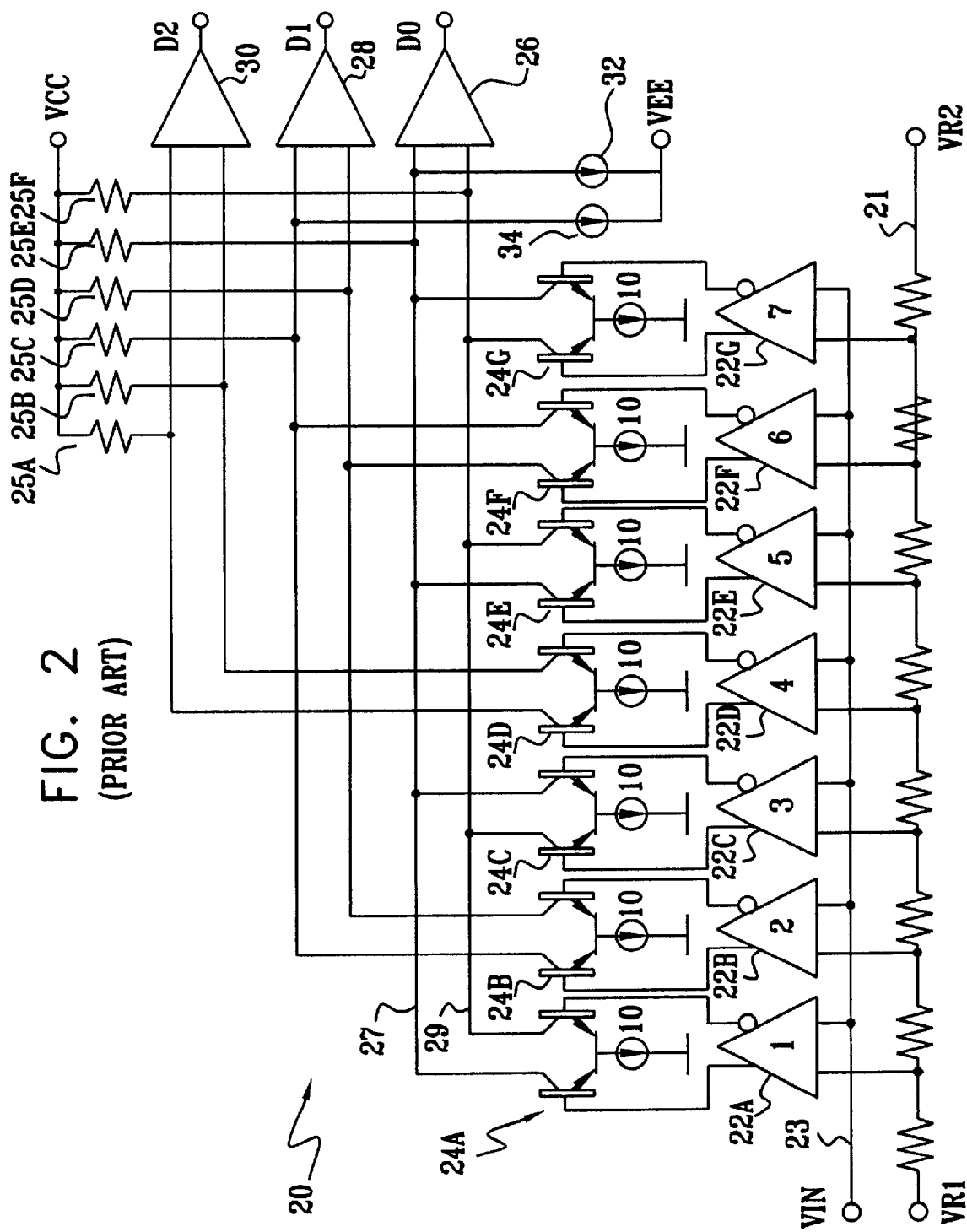
FIG. 2 is a schematic electronic diagram of a 3-bit ADC using a folded differential logic (FDL) architecture, and giving a Gray code output, as is known in the art.

Returning to FIGS. 4A and 4B, $V_{dyn}$ for line 48 is a monotonic decreasing function of M, the number of corresponding $C_2$s set. Thus, $V_{dyn}$ for line 48 decreases as the value of $T_1 + \overline{T_3} + T_5 + \overline{T_7}$ increases. Similarly, $V_{dyn}$ for line 78 is a monotonic function of the number of C4s set for line 78. Thus, $V_{dyn}$ for line 78 decreases as the value of $\overline{T_1} + T_3 + \overline{T_5} + T_7 - 1$ increases. The "−1" term corresponds to capacitor $C_4$ which is coupled to the bias signal. It will thus be appreciated that comparing signals on lines 48 and 78 gives substantially the same results as comparing signals on lines 27 and 29 of ADC 20 (FIG. 2).

Similarly, by inspection of FIGS. 5A and 5B, it will be appreciated that comparing signals on lines 98 and 128 corresponds to comparing $T_2 + \overline{T_6}$ and $\overline{T_2} + T_6 - 1$, giving substantially the same results for BIT-1 as ADC 20. Furthermore, from FIGS. 6A and 6B, comparing signals on lines 148 and 178 corresponds to comparing $T_4 - 1$ and $\overline{T_4} - 1$, giving substantially the same results for the MSB as ADC 20.

It will be appreciated that in order that measurements generated by preferred embodiments of the present invention correspond with desired output values, one or more "constant" capacitances are implemented by using a capacitance coupled to a bias level set at each charge redistribution event. Those skilled in the art will appreciate that capacitance arrangements other than those described herein may be used. For example, in an alternative preferred embodiment of the present invention, transistors 156, 150, and 152, and 186, 180, 10 and 182 (FIG. 6A) are not present, so that $T_4$ and $\overline{T_4}$ are compared.

In a further alternative preferred embodiment of the present invention, one or more "dummy" branches are added to a sub-section, in order that the sub-sections generating a bit have at least some substantially similar electrical properties. Adding one or more dummy branches, having one or more dummy circuit elements which do not materially affect operation of the sub-section wherein they are implemented, enables impedances of dynamic node lines to be balanced and allows optimization of differential behavior. Referring back to FIG. 5A and FIG. 5B, for example, a dummy branch 101 comprising a switching transistor 106, a switching transistor 100, and a transistor 102 acting as a capacitor may be implemented in sub-section 110, so that sub-sections 110 and 120 are substantially similar. In the dummy branch, the gate of transistor 106 is set so that the transistor is permanently non-conducting, i.e., so that the switch it emulates is permanently open. Thus, the capacitance of transistor 102 is never involved in the charge sharing process in which the other transistors 102 of sub-section 110 participate. However, an impedance of sub-section 110, as seen by PCHARG, will be substantially the same as an impedance of sub-section 120 as seen by PCHARG, because of the addition of dummy branch 101 in sub-section 110.

Having the ability to vary the number of dummy branches enables ADCs implemented according to the principles of the present invention to be optimized. Alternatively or additionally, an average input level to a comparator of an ADC may be adjusted to a level corresponding to maximum comparator sensitivity. Similarly, it will be appreciated that a size of primary and/or secondary capacitances in each sub-section of an ADC may be adjusted at implementation of the ADC in order to optimize performance of the specific sub-section.

It will further be appreciated that technologies other than metal oxide semi-conducting (MOS) technologies, or a combination of MOS and/or other technologies, may be utilized to implement at least some switches and/or capacitors in preferred embodiments of the present invention.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. An analog-to-digital converter, comprising:
   a code generator, coupled to receive an input analog voltage and to one or more reference voltages, and adapted to generate a digital code responsive thereto; and
   one or more folded differential logic encoders (FDLEs), each of the FDLEs comprising:
      a plurality of capacitors; and
      switching logic, coupled to receive the digital code and distribute a charge between the plurality of capacitors responsive to the received digital code, and to output a digital bit indicative of the input analog voltage responsive to a magnitude of a potential generated by the distributed charge on at least one of the plurality of capacitors.

2. Apparatus according to claim 1, wherein the code generator comprises a thermometer code generator, and wherein the digital code comprises thermometer code.

3. Apparatus according to claim 1, wherein the plurality of capacitors comprises one or more primary capacitors and wherein the switching logic comprises one or more primary switches coupled to the one or more primary capacitors, which switches are adapted to couple the one or more primary capacitors to receive the charge.

4. Apparatus according to claim 3, wherein the plurality of capacitors comprises one or more secondary capacitors, and wherein the switching logic comprises one or more secondary switches coupled to receive the digital code and to connect the one or more secondary capacitors to the one or more primary capacitors responsive to the digital code, so as to distribute the charge between the one or more primary capacitors and the one or more secondary capacitors.

5. An analog-to-digital converter, comprising:
   a code generator, coupled to receive an input analog voltage and to one or more reference voltages, and adapted to generate a digital code responsive thereto; and
   one or more folded differential logic encoders (FDLEs), each of the FDLEs comprising:
      a plurality of capacitors; and
      switching logic, coupled to receive the digital code and distribute a charge between the plurality of capacitors responsive to the received digital code, and to output a digital bit indicative of the input analog voltage responsive to a magnitude of a potential generated by the distributed charge on at least one of the plurality of capacitors,
      wherein the plurality of capacitors comprises a first group of capacitors and a second group of capacitors, wherein the switching logic comprises a first group of switches and a second group of switches, wherein the potential comprises a first potential and a second potential, and wherein at least some of the FDLEs comprise:
         a first sub-section, comprising the first group of capacitors and the first group of switches, receiving a first part of the digital code and generating the first potential responsive thereto;
         a second sub-section, comprising the second group of capacitors and the second group of switches, receiving a second part of the digital code and generating the second potential responsive thereto; and
         a comparator which outputs the digital bit responsive to a comparison of the first and the second potential.

6. Apparatus according to claim 5, wherein the first part of the digital code is substantially an inverse of the second part of the digital code.

7. Apparatus according to claim 5, wherein the first group of capacitors comprises a bias capacitor adapted to incorporate a bias level into the first potential, and wherein the first group of switches comprises a bias switch adapted to activate the bias capacitor.

8. Apparatus according to claim 5, wherein at least one of the first and second sub-sections comprises one or more dummy circuit elements, so that at least some electrical properties of the first and second sub-sections are substantially similar.

9. A method for converting an analog input voltage to a digital value, comprising:
   generating a digital cod e responsive to the input analog voltage and to one or more reference voltages;
   responsive to the digital code, distributing a charge between a plurality of capacitors in each of one or more folded differential logic encoders (FDLEs); and
   outputting a digital bit indicative of the input analog voltage from each of the one or more FDLEs responsive to a magnitude of a potential generated by the distributed charge therein.

10. A method according to claim 9, wherein the digital code comprises thermometer code.

11. A method according to claim 9, wherein the plurality of capacitors comprises one or more primary capacitors and wherein distributing the charge comprises storing the charge on the one or more primary capacitors.

12. A method according to claim 11, wherein each of the FDLEs comprises one or more secondary switches, wherein the plurality of capacitors comprises one or more secondary capacitors, and wherein distributing the charge comprises:
   the one or more secondary switches receiving the digital code; and
   connecting the one or more secondary capacitors to the one or more primary capacitors responsive to the digital code via the one or more secondary switches, so as to distribute the charge between the one or more primary capacitors and the one or more secondary capacitors.

13. A method for converting an analog input voltage to a digital value, comprising:
   generating a digital code responsive to the input analog voltage and to one or more reference voltages;
   responsive to the digital code, distributing a charge between a plurality of capacitors in each of one or more folded differential logic encoders (FDLEs); and
   outputting a digital bit indicative of the input analog voltage from each of the one or more FDLEs responsive to a magnitude of a potential generated by the distributed charge therein,
   wherein the plurality of capacitors comprises a first group of capacitors and a second group of capacitors, wherein each of the FDLEs comprises a first group of switches and a second group of switches, wherein the potential comprises a first potential and a second potential, and wherein each of the FDLEs comprises a first sub-section, comprising the first group of capacitors and the first group of switches, and a second sub-section, comprising the second group of capacitors and the second group of switches, wherein the charge comprises a first charge and a second charge, and wherein distributing the charge comprises:
      receiving a first part of the digital code in the first sub-section;
      activating the first group of switches responsive to the first part of the digital code;
      distributing the first charge responsive to the first group of activated switches;
      generating the first potential responsive to the distributed first charge;
      receiving a second part of the digital code in the second sub-section;
      activating the second group of switches responsive to the second part of the digital code;
      distributing the second charge responsive to the second group of activated switches; and
      generating the second potential responsive to the distributed second charge; and
      wherein outputting the digital bit comprises comparing the first and the second potential.

14. A method according to claim 13, wherein the first part of the digital code is substantially an inverse of the second part of the digital code.

15. A method according to claim 13, wherein the first group of capacitors comprises a bias capacitor adapted to incorporate a bias level into the first potential, and wherein the first group of switches comprises a bias switch adapted to activate the bias capacitor.

16. A method according to claim 13, wherein at least one of the first and second sub-sections comprises one or more dummy circuit elements, so that at least some electrical properties of the first and second sub-sections are substantially similar.

* * * * *